(12) United States Patent
Howard et al.

(10) Patent No.: US 10,249,102 B1
(45) Date of Patent: Apr. 2, 2019

(54) PATH-BASED PLATFORM INPUT

(71) Applicant: Rockwell Collins, Inc., Cedar Rapids, IA (US)

(72) Inventors: Sean D. Howard, Cedar Rapids, IA (US); Gabriel W. Schive, Hiawatha, IA (US); Justin D. Davis, Cedar Rapids, IA (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 301 days.

(21) Appl. No.: 15/224,423

(22) Filed: Jul. 29, 2016

(51) Int. Cl.
*G07C 5/00* (2006.01)
*G08G 5/00* (2006.01)
*G06F 17/50* (2006.01)
*G06N 99/00* (2010.01)
*H04W 76/27* (2018.01)
*H04W 4/04* (2009.01)

(52) U.S. Cl.
CPC ......... *G07C 5/008* (2013.01); *G06F 17/5009* (2013.01); *G06N 99/005* (2013.01); *G08G 5/0034* (2013.01); *H04W 4/046* (2013.01); *H04W 76/27* (2018.02)

(58) Field of Classification Search
CPC ...... G07C 5/008; H04W 76/27; H04W 4/046; G06N 99/005; G08G 5/0034; G06F 17/5009
See application file for complete search history.

(56) References Cited

U.S. PATENT DOCUMENTS

| 8,989,914 B1* | 3/2015 | Nemat-Nasser | G06F 7/00 340/988 |
| 2007/0124332 A1* | 5/2007 | Ballesty | B61L 27/0094 |
| 2012/0283893 A1* | 11/2012 | Lee | G07C 5/008 701/1 |

* cited by examiner

*Primary Examiner* — Thomas Ingram
(74) *Attorney, Agent, or Firm* — Donna P. Suchy; Daniel M. Barbieri

(57) ABSTRACT

Systems and methods for providing input using movement of a vehicle or other platform are provided. One method includes obtaining, by a processing circuit, movement data indicating movement of the vehicle, comparing, by the processing circuit, the movement data to a predefined movement pattern stored in a memory coupled to the processing circuit, and determining, by the processing circuit, whether the movement data matches the predefined movement pattern. The method further includes, in response to determining the movement data matches the predefined movement pattern, initiating, by the processing circuit, an action of the vehicle defined in the memory as corresponding to the predefined movement pattern.

19 Claims, 6 Drawing Sheets

PATH-BASED PLATFORM INPUT

BACKGROUND

Inventive concepts of the present disclosure relate generally to the field of movement-based input systems for platforms such as vehicles. More particularly, the inventive concepts of the present disclosure relate to human-machine interfaces for vehicles through which input may be provided by way of movement of the vehicle.

Input from an operator of a vehicle or other machinery is useful for a variety of tasks. However, the operator of the vehicle (e.g., pilot of an aircraft, driver of a ground-based vehicle, etc.) often has limited communication paths to a device installed on the host system. These communication paths by necessity do not provide a mechanism for communication amongst unidentified and unspecified new technology. The inventive concepts of this disclosure are used as a method which makes possible a specified communication mechanism for arbitrary new technology.

Additionally, some systems for receiving user input can distract the operator from operating the vehicle. There is a need for systems and methods that allow an operator to provide input to systems of a vehicle in ways other than using traditional input devices such as buttons and switches.

SUMMARY

In one aspect, the inventive concepts disclosed herein are directed to a method for providing input using movement of a vehicle. The method includes obtaining, by a processing circuit, movement data indicating movement of the vehicle, comparing, by the processing circuit, the movement data to a predefined movement pattern stored in a memory coupled to the processing circuit, and determining, by the processing circuit, whether the movement data matches the predefined movement pattern. The method further includes, in response to determining the movement data matches the predefined movement pattern, initiating, by the processing circuit, an action of the vehicle defined in the memory as corresponding to the predefined movement pattern.

In a further aspect, the inventive concepts disclosed herein are directed to a system. The system includes an interface configured to obtain movement data indicating movement of the vehicle and an electronic processor configured to compare the movement data to a predefined movement pattern stored in a memory coupled to the processing circuit, determine whether the movement data matches the predefined movement pattern, and, in response to determining the movement data matches the predefined movement pattern, initiate an action of the vehicle defined in the memory as corresponding to the predefined movement pattern.

In a further aspect, the inventive concepts disclosed herein are directed to a system. The system includes a position determination system configured to generate flight path data indicating movement of the aircraft. The position determination system includes at least one of a global positioning system or an inertial measurement unit of the aircraft. The system further includes a movement-based control system including a processing circuit and a memory. The processing circuit is configured to compare the flight path data to predefined flight path characteristics stored in a memory coupled to the processing circuit, determine whether the flight path data matches the predefined flight path characteristics, and, in response to determining the flight path data matches the predefined flight path characteristics, generate an indication that a flight path of the aircraft matches the predefined flight path characteristics. The system further includes an authentication system configured to authenticate the operator of the aircraft in response to receiving the indication that the flight path of the aircraft matches the predefined flight path characteristics.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1:
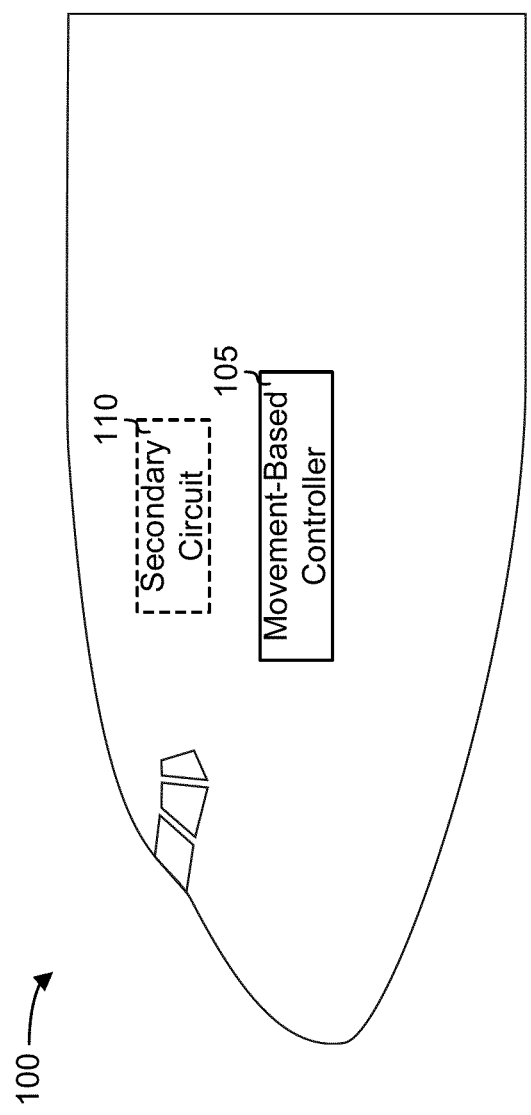
FIG. 1 is a schematic illustration of an exemplary embodiment of an aircraft according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein, a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein, any reference to "one embodiment" or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination or sub-combination of two or more such features, along with any other features which may not necessarily be expressly described or inherently present in the instant disclosure.

Broadly, embodiments of the inventive concepts disclosed herein are directed to path-based vehicle input. The inventive concepts disclosed herein can be utilized in a number of control systems for various types of applications. While the present disclosure describes systems and methods implementable for providing input from a pilot of an aircraft, the inventive concepts disclosed herein may be used in any type of environment (e.g., in another aircraft, a spacecraft, a ground-based vehicle, or in a non-vehicle application such as a ground-based computing system). While certain examples and embodiments of the inventive concepts disclosed herein are described with respect to a pilot of an aircraft, it will be appreciated that users other than a pilot may use and benefit from the inventive concepts disclosed herein with respect to other vehicles and/or objects.

Referring now to FIG. 1, a schematic illustration of an exemplary embodiment of an aircraft 100 is shown according to the inventive concepts disclosed herein. Aircraft 100 includes a movement-based controller 105 that obtains input from a pilot of the aircraft 100 based on movement of the aircraft 100. The pilot of the aircraft 100 may wish to provide input to various systems of the aircraft 100, but may have limited communication paths to the systems. For example, in a future combat training system, the pilot of an F35 aircraft has limited switch relays designated for an installed Pod. The limited input devices are often hardware-based in nature, as the host platforms are often built long before other devices such as training devices are installed.

The movement-based controller 105 allows for the pilot of the aircraft 100 to provide input via movement of the aircraft 100. The movement-based controller 105 uses movement of a sub-system that includes a navigation capability (e.g., a positioning or navigation system of the aircraft 100) to enable communication to the sub-system from the entity controlling the movement. For example, in some embodiments, the aircraft 100 includes a Global Positioning System (GPS) and/or Inertial Measurement Unit (IMU) that enables the aircraft 100 to navigate in a three-dimensional (3D) space, and the pilot flies the aircraft 100 in 3D space through a pattern that the sub-system recognizes and uses as information provided from the pilot.

The input data obtained by the movement-based controller 105 may be used to trigger a variety of different actions. In some embodiments, the actions may be implemented by the movement-based controller 105 itself. In some embodiments, the movement-based controller 105 may generate signals based on recognized movement patterns and transmit the signals to a secondary circuit 110 of the aircraft 100, which may implement actions in response to the signals. The secondary circuit 110 may be any of a variety of different types of circuitry, such as circuitry configured to perform authentication, provide navigation and/or position data, identify terrain and/or weather-related threats, implement simulation and/or training programs, provide data to the pilot of the aircraft 100, transmit data to computing systems remote from the aircraft 100, and/or perform other types of functions. In various embodiments, the actions performed in response to patterns of movement detected by the movement-based controller 105 include, but are not limited to, authenticating the pilot, adjusting settings of simulation and/or training sessions, altering settings of communication equipment, changing operating modes of systems of the aircraft 100, and/or jettisoning equipment from the aircraft 100.

While the vehicle shown in FIG. 1 is an aircraft, it should be appreciated that the inventive concepts disclosed herein may be utilized with any type of vehicle, including various types of air-based vehicles (e.g., airplanes, helicopters, drones, etc.), land-based vehicles (e.g., cars, trucks, heavy equipment, etc.), water-based vehicles (e.g., ships), or any other types of vehicles. For example, the inventive concepts disclosed herein could be used to obtain input from an operator of an automobile based on the two-dimensional movement of the automobile. For purposes of the present disclosure, the term "vehicle" should be interpreted to include any machinery capable of movement, and is not limited to the specific examples provided herein.

Further, embodiments of the inventive concepts disclosed herein may be used with devices other than vehicles as well. For example, in some embodiments, a movement-based controller having features such as those described herein may be implemented within a mobile computing device held or worn by a user, mounted to a vehicle, etc. The device may detect its movement and/or position and determine the movement to correspond to input from a user of the mobile computing device. The device may then perform an action and/or transmit data to an external device configured to cause the external device to perform an action.

Figure 2:
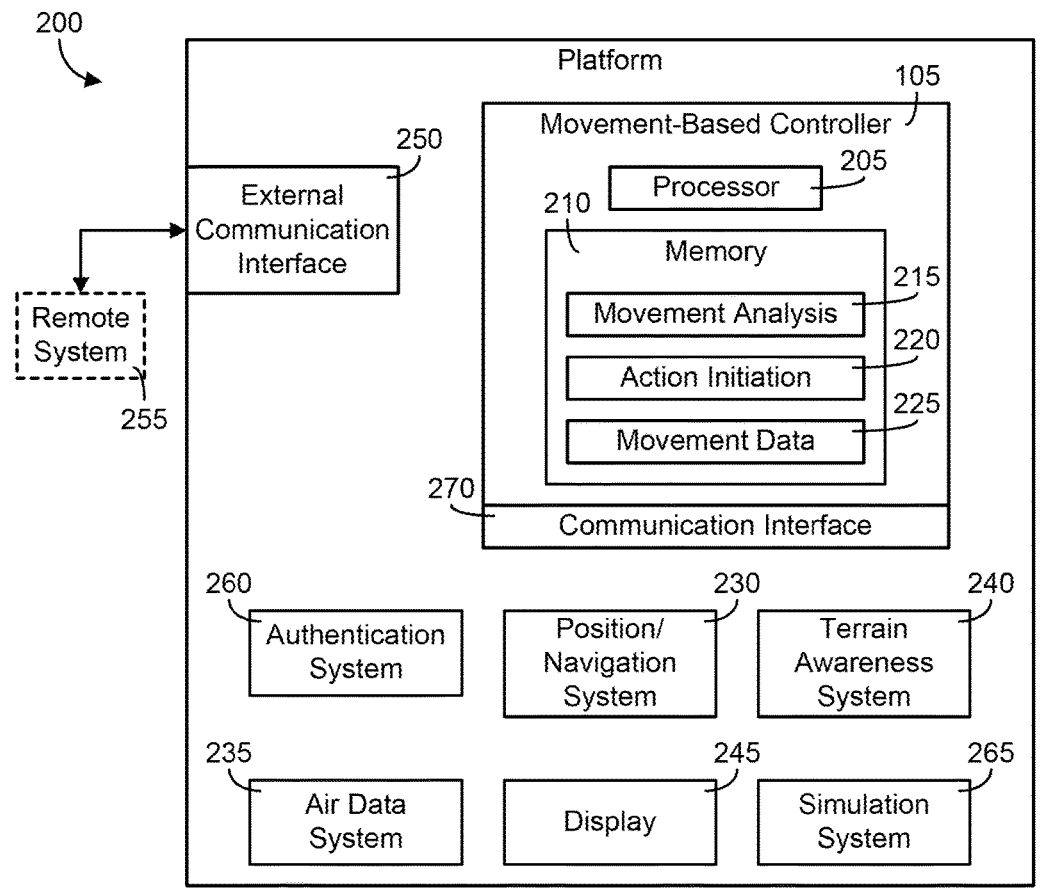
FIG. 2 is a block diagram of an exemplary embodiment of a movement-based controller for a vehicle.

Referring now to FIG. 2, a block diagram of an illustrative platform 200 is shown according to an exemplary embodiment. The platform 200 may be an air-based platform, such as a fixed-wing or rotary-wing aircraft (e.g., the aircraft 100). In some exemplary embodiments, other types of platforms (e.g., water and/or land-based platforms, such as ships, trucks, buses, trains, etc.) may include at least some of the same or similar components to those shown in FIG. 2. In some embodiments, one or more components shown in FIG. 2 (e.g., the movement-based controller 105) may be implemented in circuitry of a device other than a device of a vehicle, such as a mobile computing device.

The platform 200 includes the movement-based controller 105 that obtains input based on movement of the platform 200 and performs actions in response to the input. In the illustrated embodiment, the movement-based controller 105 includes a processor 205 and a memory 210. The processor 205 may be implemented as a specific purpose processor, an application specific integrated circuit (ASIC), one or more field programmable gate arrays (FPGAs), a group of processing components, or other suitable electronic processing components. The memory 210 is one or more devices (e.g., RAM, ROM, flash memory, hard disk storage) for storing data and computer code for completing and facilitating the various user or client processes, layers, and modules described in the present disclosure. The memory 210 may be or include volatile memory or non-volatile memory and may include database components, object code components, script components, or any other type of information structure for supporting the various activities and information structures of the inventive concepts disclosed herein. The memory 210 is communicably connected to the processor 205 and includes computer code or instruction modules for executing one or more processes described herein.

The memory 210 includes various modules that cause the processor 205 to execute the systems and methods described herein. The memory 210 includes a movement analysis module 215 configured to receive input representative of movement of the platform 200 and determine whether the input corresponds to a predetermined movement pattern reflected in movement data 225 stored in the memory 210 and/or in another computer-readable storage medium communicably connected to the movement-based controller 105. In some embodiments, movement data 225 includes multiple different movement patterns corresponding to different predetermined types of input, and the movement analysis module 215 compares received input to the different movement patterns to determine if the input matches one of the patterns. In various embodiments, the movement analysis module 215 obtains input data representative of actual movement of the platform 200 (e.g., data from a position/navigation system 230) or intended movement of the platform 200 (e.g., from an input/control device of the platform 200, such as a joystick, wheels).

The memory 210 may also include an action initiation module 220 configured to cause one or more actions to be performed in response to the movement analysis module 215 detecting a match between the input and a predetermined movement pattern. An action initiation module 220 may directly perform actions (e.g., authenticating a user using authentication processes implemented within the movement-based controller 105) or may generate signals and transmit the signals to other components internal or external to the platform 200 to cause actions to be executed. For example, in some embodiments, other components may be implemented as separate circuitry/hardware communicably coupled to the movement-based controller 105 via a communication interface 270 of the movement-based controller 105. Some such components that may be used to implement actions in response to movement-based input include, but are not limited to, a position/navigation system 230, an air data system 235, a terrain awareness system 240, a display 245, an authentication system 260, a simulation system 265, and/or a remote system 255 remote from the platform 200 that communicates with the platform 200 via an external communication interface 250 (e.g., a wireless interface).

Figure 3:
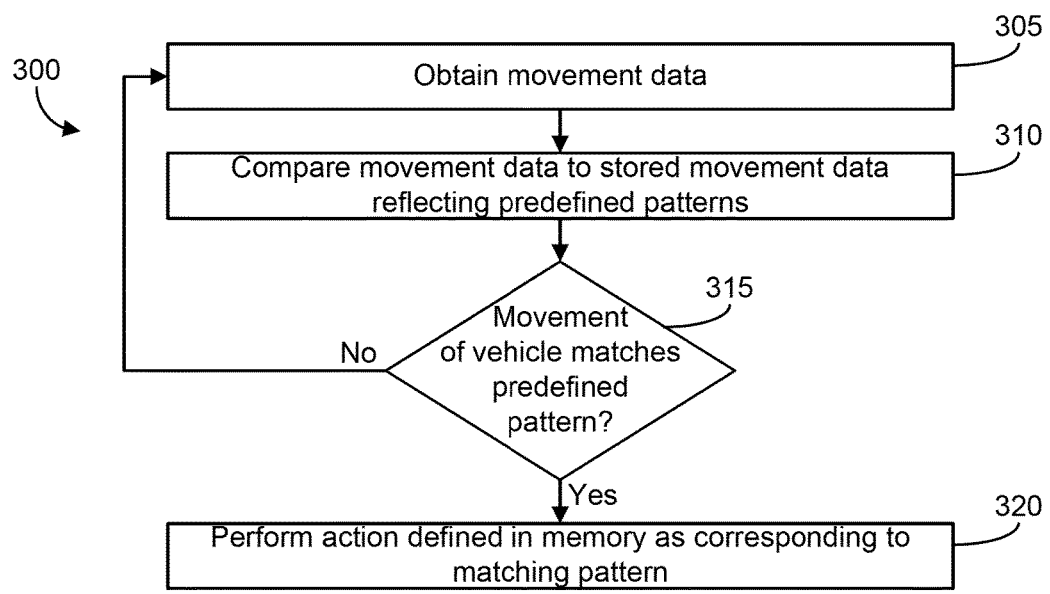
FIG. 3 is a diagram of an exemplary embodiment of a method of obtaining input based on movement of a vehicle according to the inventive concepts disclosed herein.

FIG. 3 illustrates a flow diagram of a process 300 for obtaining input based on movement of the platform 200 according to an exemplary embodiment. Referring now to both FIGS. 2 and 3, a step (305) may include obtaining movement data. In some embodiments, the movement data may be obtained from one or more position/navigation systems 230, such as an onboard GPS or an IMU. A GPS may obtain a position of the platform 200 at one or more times and generate position data (e.g., latitude and longitude) correlated to timestamps. In some embodiments, an IMU may provide position and/or movement data alone or in combination with position data from the GPS. The IMU may obtain data indicating an attitude, acceleration, roll, and/or other movement characteristics of the platform 200. In some embodiments, the IMU may be a six-axis IMU that can measure changes in altitude, velocity, second and/or third derivatives of movement, and/or other movement characteristics of the platform 200. In some embodiments, the movement-based controller 105 may utilize GPS data to establish a position of the platform 200 and movement data from the IMU to supplement (e.g., improve the accuracy of) the position data from the GPS. In some embodiments and/or under some circumstances, the IMU may be used alone to determine movement. For example, movement data from the IMU may be used by the movement-based controller 105 without GPS data in circumstances where the GPS is jammed or a simulation is being performed in which the GPS is simulated as being jammed. In some implementations, the IMU may be used as a backup for dead reckoning. In some embodiments, the movements-based controller 105 may obtain input representative of intended movement from an input device used by an operator to control movement, such as a joystick, wheel, buttons, switches, etc. In some such embodiments, the input may be representative of a desired direction and magnitude of movement (e.g., amount of movement, velocity and/or acceleration, etc.). In some embodiments, the movement data may be obtained from one or more flight instruments designed to monitor and/or control movement of an aircraft.

The movement-based controller 105 may compare the input movement data obtained by the movement-based controller 105 to stored movement data 225 reflecting one or more predefined patterns of movement (310) and determine whether the movement of the platform 200 matches a predefined pattern (315). In some embodiments, the movement-based controller 105 may determine whether a set of one or more locations of the platform 200 matches a set of one or more predetermined locations defined by movement data 225. For example, in some embodiments, the movement-based controller 105 may determine that a location of the platform 200 matches a single predetermined location at which a particular action (e.g., the beginning of a simulation or training exercise) is to be triggered. For example, in some embodiments, particular systems/features/functions of the platform 200 may be activated or deactivated automatically in response to reaching a particular predetermined location. In some embodiments, the movement-based controller 105 may determine that a series of two or more locations of the platform 200 matches a series of locations of a predetermined pattern intended to trigger a particular action. In some embodiments, the movement-based controller 105 may determine that a set of one or more maneuvers of the platform 200 match a set of predetermined maneuvers designated to trigger an action.

Figure 4:
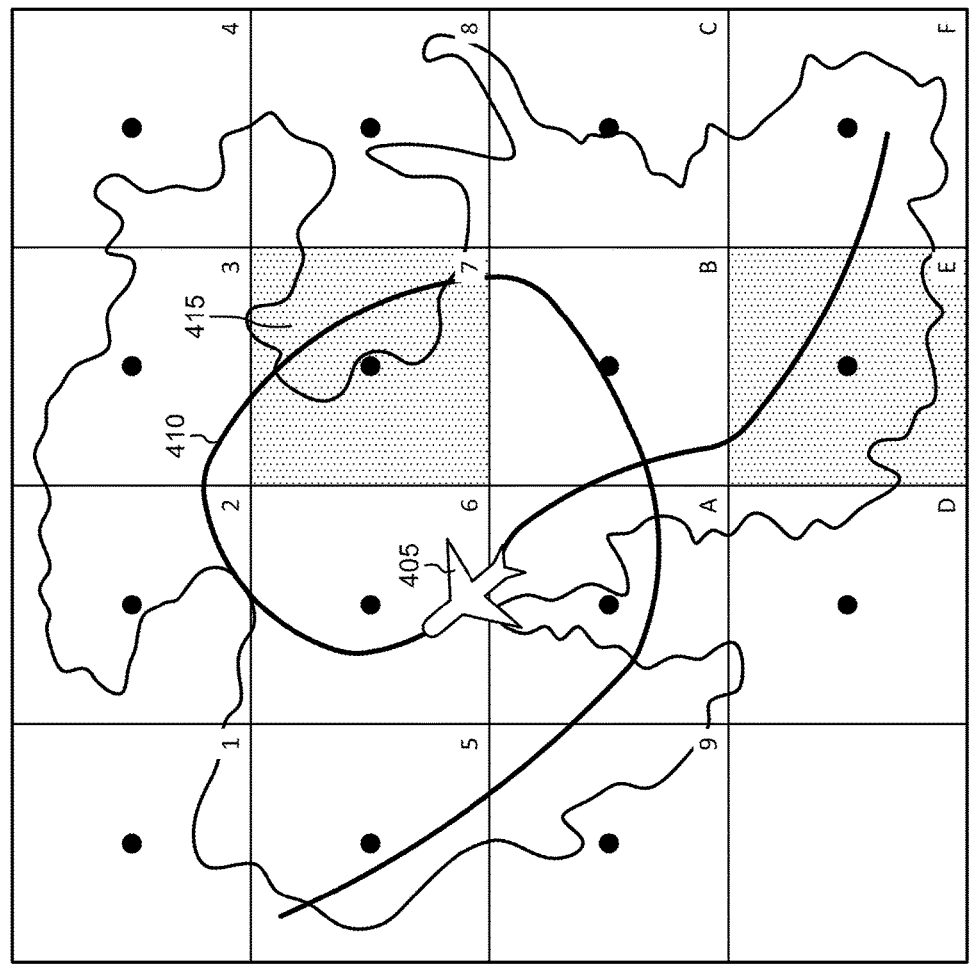
FIG. 4 is an illustration of an exemplary embodiment for obtaining input based on motion of an aircraft according to the inventive concepts disclosed herein.

The movement-based controller 105 may match input data reflective of movement of the platform 200 to patterns reflected in movement data 225 in any of a variety of ways. In some embodiments, the movement-based controller 105 may partition a geographic area in which movement of the platform 200 occurs into multiple regions and determine whether the platform 200 travels through a series of predetermined regions corresponding to a particular action. Referring now to FIG. 4, an illustration of an exemplary embodiment for obtaining input based on motion of an aircraft 405 is shown. In the illustrated embodiment, a geographic region 400 is partitioned into multiple quadrants 415, labeled 1-9 and A-F. Each quadrant 415 may be defined by a range of coordinates (e.g., a range of latitudes and range of longitudes). In the illustrated embodiment, each quadrant 415 is defined in a two-dimensional space. In other embodiments, however, geographic region 400 could be partitioned in three-dimensions, and each quadrant 415 may be defined within a three-dimensional coordinate system (e.g., as a range of latitudes, a range of longitudes, and a range of altitudes).

The aircraft 405 travels along a flight path 410. A movement-based controller of the aircraft 405 determines whether quadrants 415 intersected by the flight path 410 match a movement pattern stored in a memory. In the illustrated implementation, the movement-based controller determines whether a pattern is matched based on whether the flight path 410 intersects quadrants E and 7. In some embodiments, the pattern may be defined based on the flight path 410 traveling through both quadrants E and 7, regardless of the order in which the quadrants are reached. In some embodiments, the pattern may be defined based on the aircraft 405 traveling first through quadrant E and then later through quadrant 7, in that order. In some embodiments, the pattern may be defined according to a series of adjacent quadrants through which the flight path 410 travels to be deemed a match. For example, a pattern may be defined such that the movement of the aircraft 405 is a match if it travels through quadrants E, B, A, and 6, in that order, but not if it travels through quadrants E, B, 7, and 6. In the manner described above, the movement-based input may operate similar to a PIN pad, where the movement of the aircraft activates the buttons of the pad. In some embodiments, the coordinate system may be predefined for a mission and stored in memory.

The manner in which the pattern of positions of the platform is defined, according to this and other embodiments described herein, can include one or more of a variety of implementations. For example, in some implementations, the pattern may be defined according to an absolute time associated with the positions. In some such implementations, the pattern may be defined based on the time parameters of the mission, such that, within a first time range, the platform must be within a first quadrant, within a second time range, the platform must be within a second quadrant, etc. In some implementations, the pattern may be defined such that, by a first time, the platform should have passed into or through a first quadrant, by the second time, the platform should have passed into or through a second quadrant, etc. In some implementations, the pattern may be defined according to a relative time from a reference time, such as a start of a mission/training session, a time at which the platform entered a first quadrant associated with the pattern, a time from entry into or exit from a last quadrant associated with the pattern, etc. In one such example, a pattern may be defined such that the platform should enter a second quadrant associated with the pattern within 30 seconds after entering or exiting a first quadrant associated with the pattern to be considered a match. In still further implementations, the pattern may be defined based on an action of the operator of the platform, alone or in addition to time factors such as those noted above. For example, in some implementations, the pattern may be defined according to a series of quadrants in which the platform is traveling when an operator of the platform presses a button or provides input via another input device (e.g., the movement of the platform is considered to match the pattern if the operator first presses a button when the platform is in a first quadrant, such as quadrant E, and next presses the button when the platform is in a second predefined quadrant, such as quadrant 7).

Figure 5:
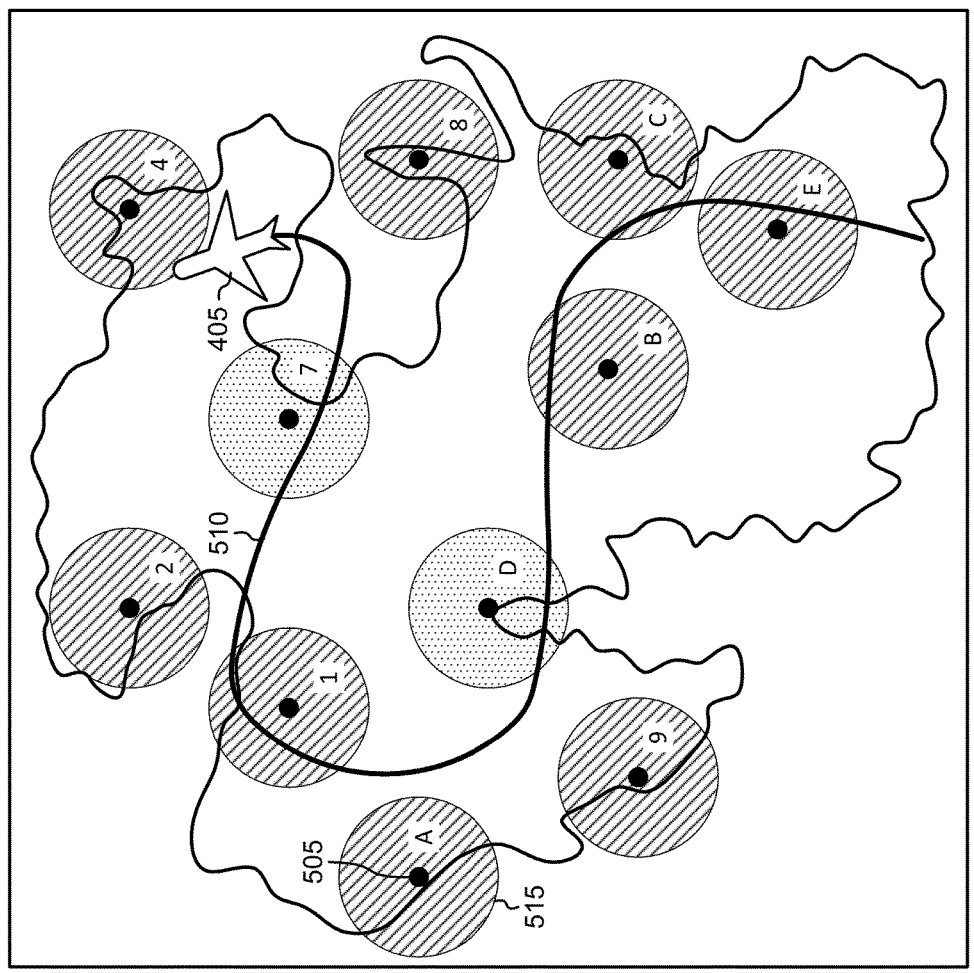
FIG. 5 is an illustration of an exemplary embodiment for obtaining input based on motion of an aircraft according to the inventive concepts disclosed herein.

In some embodiments, a predetermined pattern may be defined based on a set of one or more landmarks near to which the platform travels. Referring now to FIG. 5, an illustration of another exemplary embodiment for obtaining input based on motion of the aircraft 405 is shown. In the illustrated embodiment, a geographic region 500 includes several landmarks 505 on a land mass, with the landmarks being labeled 1, 2, 4, 7, 8, 9, and A-E. A pattern may be defined according to a set of one or more landmarks 505 near to which the aircraft 405 travels. The movement-based controller may determine a flight path 510 of the aircraft 405 to have traveled near to a particular landmark 505 if the flight path 510 traveled within a predetermined radius of the landmark 505, such that the flight path 510 travels within an area 515 around the landmark 505. In various embodiments, the area 515 may be defined in two dimensions (e.g., latitude and longitude) or three dimensions (e.g., latitude, longitude, and altitude).

In the illustrated embodiment, the movement-based controller determines the flight path 510 matches a predefined pattern based on the flight path 510 traveling near landmarks D and 7. In some embodiments, the pattern may be defined as including any flight path that travels near landmarks D and 7 (e.g., at any point, within a particular timeframe, in conjunction with other input from the user). In some embodiments, the pattern may be defined as including only flight paths that first travel near landmark D and then travel near landmark 7. Whether a flight path meets the predefined pattern may, in some embodiments, further depend on time factors and/or coordination with other user input (e.g., button presses), as described in further detail above.

Figure 6:
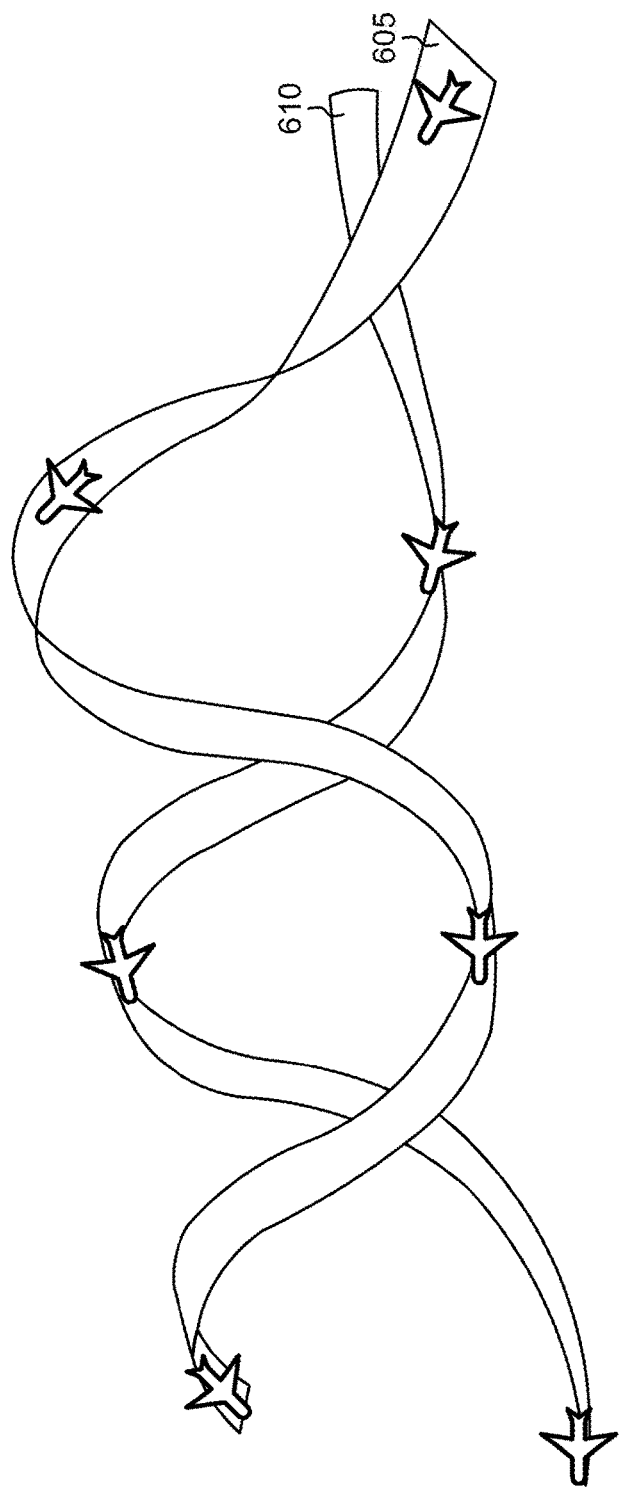
FIG. 6 is an illustration of an exemplary embodiment for obtaining input based on motion of an aircraft according to the inventive concepts disclosed herein.

In some embodiments, a predetermined pattern may be defined according to a set of one or more maneuvers of the platform. Referring now to FIG. 6, an illustration of an exemplary embodiment for obtaining input based on motion of an aircraft is shown. In the illustrated embodiment, a first maneuver 605 is determined to match a pattern of movement corresponding to a first type of action, such as starting a simulation. A second maneuver 610 is determined to match a pattern of movement corresponding to a second type of action, such as ending a simulation. In the illustrated embodiment, first maneuver 605 is a roll of the aircraft in a first direction and second maneuver 610 is a roll of the aircraft in an opposition direction. In various embodiments, the maneuvers may be or include any type of maneuver or set of two or more maneuvers, such as rolling, changing direction, changing altitude, changing attitude, changing speed, banking, etc. In some embodiments, the pattern may be defined as two or more types of maneuvers executed in a specific order, such as a roll followed by a bank. In some embodiments, whether the maneuvers satisfy the pattern may be dependent upon a time and/or location at which the maneuvers are performed.

Referring again to FIGS. 2 and 3, if movement is determined to match a predetermined pattern, the movement-based controller 105 may perform one or more actions defined as corresponding to the matching pattern (320). The movement-based controller 105 may perform or initiate any of a wide variety of different actions in response to detecting a matching pattern of movement, according to various implementations. In some embodiments, the movement-based controller 105 may perform the actions itself, such as by performing an authentication routine stored in the memory 210 using the matched pattern. In some embodiments, the movement-based controller 105 may transmit signals to one or more secondary circuits via the communication interface 270, causing the secondary circuits to implement actions. In some embodiments, the action to be performed may be stored in movement data 225 (e.g., movement data 225 may include data reflecting a predefined pattern and data indicating a corresponding action to be performed when the pattern is detected).

In some embodiments, an operator of the platform 200 may be authenticated based at least in part on the movement of platform 200 matching a predefined pattern stored in movement data 225. For example, upon detecting a matching pattern, the movement-based controller 105 may perform an authentication procedure itself or may transmit a signal to an authentication system 260 indicating the pattern match. The authentication system 260 may in turn authenticate the operator based on the matched pattern, alone or in combination with a secondary authentication factor. In the case of multi-factor authentication, the movement-based authentication would fall into the category of "something you do." In some implementations, the movement-based pattern matching may be used as the sole authentication factor to authenticate the operator. In some implementations, the movement-based pattern matching may be one of multiple different authentication steps in a multi-factor authentication scheme. In such implementations, secondary authentication data is used in combination with the determination of whether the movement matches a predetermined pattern to authenticate the user. The secondary authentication may be based on a user-provided password, entry of a device into a terminal of platform 200 (e.g., an electronic or physical key specific to the operator), activating input devices (e.g., buttons) at a certain time, in a certain order, etc., biometric input, data received from a remote device, or any other type of secondary authentication. In some embodiments, the movement-based pattern matching may be used as part of a crypto-ignition scheme. In some embodiments, authentication using movement-based pattern matching may allow for authentication using a pre-placed key dictionary and a flight path or movement path without requiring a group infrastructure (e.g., multiple tokens, ground infrastructure, etc.) to authenticate the unit to begin encryption. In some embodiments, once the operator is authenticated, one or more systems or features of platform 200 may be activated.

In some implementations, the position/navigation system 230 (e.g., a Time and Space Position Information, or TSPI, system) may generate data and transmit the data to movement-based controller 105. GPS data and/or data from the IMU may be used, alone or in combination with other input, to create an encryption key and authenticate cryptography. In particular, the movement-based controller 105 may determine if the obtained movement matches a predetermined pattern and, if so, generates a signal indicative of the match to the authentication system 260. In response to the signal, the authentication system 260 generates a public certificate under the X.509 standard. In some embodiments, the public certificate may be generated using private keys distributed by the U.S. National Security Agency or another similar entity. In some embodiments, a private key value (e.g., hex value) may determine a set of locations to which platform 200 must travel to authenticate based on motion of the platform 200. For example, in one embodiment, the private key value 0x7C may indicate that the platform 200 must travel first to a quadrant labeled 7 and then to a quadrant labeled C to match the predetermined pattern and authenticate. Utilizing predefined movements to authenticate may provide a similar level of security to requiring entry of a PIN (e.g., under a "something you know" scheme of authentication).

In some embodiments, the movement-based pattern matching may be used to change a setting of a simulation session. A simulation system 265 of the platform 200 may implement one or more simulations designed to simulate various types of operations or missions for an operator of the platform 200. For example, the simulation system 265 may implement simulations in which the operator is asked to perform certain maneuvers with the platform 200, operate the platform 200 when certain systems of the platform 200 are simulated to be malfunctioning, etc. In some embodiments, in response to detecting a match between movement of the platform 200 and a predetermined pattern, the movement-based controller 105 may transmit a signal to the simulation system 265 configured to cause the simulation system 265 to change settings of a simulation session. In various embodiments, the stimulation system 265 may, in response to receiving the signal, begin a simulation session, end a simulation session, pause a simulation session, reset a simulation session to a starting state, change one or more parameters associated with the simulation (e.g., actions the operator is asked to perform under the session), and/or modify other settings. In some embodiments, the simulation system 265 may implement a training session designed to train the operator to handle a particular type of scenario (e.g., combat scenario, inclement weather, etc.), and the simulation system 265 may modify one or more parameters of the training session in response to the signal (e.g., start or stop the training session, change a severity of the conditions being simulated, change the platform 200 from one team to another in a team-based training operation).

In some embodiments, the movement-based pattern matching may be used to change settings of a radio or other signal transmission component of the platform 200. For example, a radio may change from an active transmission mode in which transmissions are allowed to a silent mode in which transmissions are limited or the radio does not transmit in response to determining the movement satisfies a predetermined pattern. In some such implementations, flying an aircraft over a particular zone (e.g., defined by latitude and longitude) at a particular altitude may cause the radio to transition to silent mode.

In some embodiments, the movement-based pattern matching may be used to modify settings of one or more transmission devices. For example, characteristics of transmissions over an antenna of the platform 200 (e.g., via a radio), such as a frequency and/or a power level of the transmissions, may be modified in response to movement of the platform 200 matching a pattern. It is often a safety concern that pilots landing may have DLT antenna transmissions at a high level (e.g., maximum power), which can cause damage to equipment. Using movement-based control would allow for automatic control of the power level of the antenna transmissions at a certain altitude and/or within a certain zone (e.g., near a landing zone). For example, on approach, the transmissions may be sent into a low power mode (e.g., DLT goes to 1 W power when low altitude and near the landing strip). When beyond range of particular infrastructure, the power may be set to a higher or highest level to ensure network connectivity without operator intervention.

In some embodiments, the movement-based pattern matching may be used to jettison a piece of equipment from the platform 200. For example, in response to executing a particular maneuver or navigating to a particular location or series of locations, an operator of the platform 200 may cause the platform 200 to jettison a piece of test equipment or other type of equipment, such as to keep sensitive data from being obtained or destroyed, reduce weight of the platform 200, etc.

In some embodiments, the movement-based pattern matching may be used to change a mode of one or more components of the platform 200. For example, a computer of the platform 200 may activate or deactivate a debugging mode in response to the movement-based controller 105 detecting a matched pattern of movement. In the debugging mode, information regarding operation of the systems of the platform 200 may be collected. In some implementations, information may be displayed on a display 245 of the platform 200 to allow for live troubleshooting of one or more components of the platform 200.

In various embodiments, various other types of actions may be implemented in response to detecting a matched movement pattern. For example, the movement-based controller 105 may, in response to detecting a matched pattern, cause a component of the platform 200 to reboot, start or stop recording data or clear previously recorded data, modify terrain detection and warning settings of the terrain awareness system 240, modify settings of an air data system 235 (e.g., an air data computer) configured to collect wind, air speed, and/or other data, modify data displayed on the display 245, cause data to be transmitted to a remote system 255, etc.

As will be appreciated from the above, the path-based platform input systems and methods according to embodiments of the inventive concepts disclosed herein may allow for various advantages, including, but not limited to: providing authentication in a rangeless environment (e.g., where usability is a discriminator for TARMAC to flight times); functionality improvements based at least partially in software (e.g., allowing retrofitting in existing systems) for human machine interface operations (e.g., allowing addition of extra inputs to the device through navigation patterns); allowing similar functionality in various different types of aircraft (continuity of user experience); allowing large-scale extensibility of control features using different movement patterns; and allowing a user to provide input without taking focus off of navigating the platform.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried out in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A method for providing input using movement off vehicle, the method comprising:
    obtaining, by a processing circuit, movement data indicating movement of the vehicle;
    comparing, by the processing circuit, the movement data to a predefined movement pattern stored in a memory coupled to the processing circuit;
    determining, by the processing circuit, whether the movement data matches the predefined movement pattern; and
    in response to determining the movement data matches the predefined movement pattern, initiating, by the processing circuit, an action of the vehicle defined in the memory as corresponding to the predefined movement pattern, wherein the vehicle is an aircraft, and wherein determining whether the movement data matches the predefined movement pattern comprises determining whether a flight path of the aircraft matches a predefined flight path.

2. The method of claim 1, wherein determining whether the movement data matches the predefined movement pattern comprises determining whether a set of locations of the vehicle indicated by the movement data matches a predetermined set of locations.

3. The method of claim 2, wherein a geographic area in which the movement of the vehicle occurs is partitioned into a plurality of regions, and wherein determining whether the set of locations of the vehicle indicated by the movement data matches the predetermined set of locations comprises determining whether a series of the regions through which the movement data indicates the vehicle has passed matches a predetermined pattern of regions.

4. The method of claim 2, further comprising defining, within the memory, a plurality of geographic landmarks, wherein determining whether the set of locations of the vehicle indicated by the movement data matches the predetermined set of locations comprises determining whether a series of the geographic landmarks near which the movement data indicates the vehicle has passed matches a predetermined pattern of landmarks, wherein the vehicle is determined to have passed near one of the plurality of geographic landmarks if the movement data indicates a position of the vehicle was within a predetermined radius of a location of the geographic landmark.

5. The method of claim 1, wherein determining whether the movement data matches the predefined movement pattern comprises determining whether a sequence of maneuvers of the vehicle matches a predefined sequence of maneuvers.

6. The method of claim 1, wherein initiating the action of the vehicle comprises authenticating an operator of the vehicle in response to determining the movement data matches the predefined movement pattern.

7. The method of claim 6, further comprising obtaining secondary authentication data and authenticating the operator in response to both determining the movement data matches the predefined movement pattern and verifying the secondary authentication data.

8. The method of claim 1, wherein initiating the action of the vehicle comprises at least one of:
    beginning, ending, or resetting a simulation session in response to determining the movement data matches the predefined movement pattern; or
    modifying a parameter of a training operation in which the vehicle is participating in response to determining the movement data matches the predefined movement pattern.

9. The method of claim 1, wherein initiating the action of the vehicle comprises at least one of:
   causing a radio of the vehicle to enter a silent mode in which the radio does not transmit in response to determining the movement data matches the predefined movement pattern; or
   modifying at least one of a frequency or a power of transmissions from the vehicle in response to determining the movement data matches the predefined movement pattern.

10. The method of claim 1, wherein initiating the action of the vehicle comprises modifying at least one of a frequency or a power of transmissions from the vehicle in response to determining the movement data matches the predefined movement pattern.

11. The method of claim 1, wherein initiating the action of the vehicle comprises jettisoning a piece of equipment from the vehicle in response to determining the movement data matches the predefined movement pattern.

12. The method of claim 1, wherein initiating the action of the vehicle comprises activating a debugging mode for debugging a system of the vehicle in response to determining the movement data matches the predefined movement pattern.

13. A system for providing input using movement of a vehicle,
   the system comprising:
      an interface configured to obtain movement data indicating movement of the vehicle; and
      an electronic processor configured to:
         compare the movement data to a predefined movement pattern stored in a memory coupled to the processing circuit;
         determine whether the movement data matches the predefined movement pattern;
         obtain secondary authentication data; and
         in response to determining the movement data matches the predefined movement pattern, initiate an action of the vehicle defined in the memory as corresponding to the predefined movement pattern by authenticating an operator of the vehicle in response to both determining the movement data matches the predefined movement pattern and verifying the secondary authentication data.

14. The system of claim 13, wherein the electronic processor is configured to determine whether a set of locations of the vehicle indicated by the movement data matches a predetermined set of locations.

15. The system of claim 14, wherein a geographic area in which the movement of the vehicle occurs is partitioned into a plurality of regions, and wherein the electronic processor is configured to determine whether a series of the regions through which the movement data indicates the vehicle has passed matches a predetermined pattern of regions.

16. The system of claim 14, further comprising defining, within the memory a plurality of geographic landmarks, wherein the electronic processor is configured to determine whether a series of the geographic landmarks near which the movement data indicates the vehicle has passed matches a predetermined pattern of landmarks, wherein the electronic processor is configured to determine the vehicle to have passed near one of the plurality of geographic landmarks if the movement data indicates a position of the vehicle was within a predetermined radius of a location of the geographic landmark.

17. The system of claim 13, wherein the electronic processor is configured to determine whether a sequence of maneuvers of the vehicle matches a predefined sequence of maneuvers.

18. The system of claim 13, wherein the electronic processor is configured to implement at least one of the following actions in response to determining the movement data matches the predefined movement pattern:
   authenticating an operator of the vehicle; or
   at least one of beginning, ending, or resetting a simulation session.

19. A system for authenticating an operator of an aircraft, the system comprising:
   a position determination system configured to generate flight path data indicating movement of the aircraft, the position determination system comprising at least one of a global positioning system of an inertial measurement unit of the aircraft;
   a movement-based control system comprising a processing circuit and a memory, the processing circuit configured to:
      compare the flight path data to predefined flight path characteristics stored in a memory coupled to the processing circuit;
      determine whether the flight path data matches the predefined flight path characteristics; and
      in response to determining the flight path data matches the predefined flight path characteristics, generate an indication that a flight path of the aircraft matches the predefined flight path characteristics; and
   an authentication system configured to authenticate the operator of the aircraft in response to receiving the indication that the flight path of the aircraft matches the predefined flight path characteristics.

* * * * *